United States Patent
Chen et al.

(10) Patent No.: US 7,592,036 B2
(45) Date of Patent: Sep. 22, 2009

(54) METHOD FOR MANUFACTURING NAND FLASH MEMORY

(75) Inventors: Kuei-Yun Chen, Hsinchu (TW); Chun-Lien Su, Hsinchu (TW); Yin-Jen Chen, Hsinchu (TW); Ming-Shang Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 621 days.

(21) Appl. No.: 11/435,459

(22) Filed: May 16, 2006

(65) Prior Publication Data

US 2007/0269947 A1  Nov. 22, 2007

(51) Int. Cl.
*B05D 5/12* (2006.01)
(52) U.S. Cl. .......................................... 427/58
(58) Field of Classification Search .................... 427/58
See application file for complete search history.

(56) References Cited

U.S. PATENT DOCUMENTS

| | | | |
|---|---|---|---|
| 6,624,023 B1 | 9/2003 | Han et al. | 438/257 |
| 6,897,116 B2 | 5/2005 | Lee et al. | 438/267 |

*Primary Examiner*—Roberts Culbert
(74) *Attorney, Agent, or Firm*—J.C. Patents

(57) ABSTRACT

A method for manufacturing a NAND flash memory is provided. First, a substrate is provided. Next, a tunneling dielectric layer, a first conductive layer and a mask layer are sequentially formed on the substrate. Next, a plurality of isolation structures is formed in the mask layer, the first conductive layer, the tunneling dielectric layer and the substrate. Next, the mask layer is removed, so that the top surface of each isolation structure is higher than that of the first conductive layer. Next, a second conductive layer is formed on the exposed sidewalls of the isolation structures. Next, an intergate dielectric layer and a third conductive layer are sequentially formed on the substrate.

16 Claims, 5 Drawing Sheets

METHOD FOR MANUFACTURING NAND FLASH MEMORY

BACKGROUND OF THE INVENTION

1. Field of the Invention

The present invention relates to a method for manufacturing a memory element, and more particularly, to a method for manufacturing a NAND flash memory.

2. Description of the Related Art

Flash memory has become a kind of nonvolatile memory widely used in personal computers (PCs) and electronic products, as it is capable of storing, reading and erasing data for several times, and the data stored therein will be retained even after a power to the device is cut off.

A typical flash memory has a floating gate and a control gate comprised of doped poly-silicon. Generally, the higher the gate-coupling ratio (GCR) between the floating gate and the control gate, the lower the working voltage required, and correspondingly the higher the operation speed of the memory. The GCR refers to the ratio of a capacitance value between the float gate and the control gate to an overall capacitance value of the memory, such that increasing an equivalent capacitor area between the float gate and the control gate will facilitate increase in the GCR.

However, to satisfy design trends for integrated circuits (ICs), continuously pursuing increasingly higher integration, the area occupied by each memory cell must be reduced and the line width of the element must also be reduced. Thus, the GCR between the floating gate and the control gate will be reduced accordingly, and thereby, the working voltage required by nonvolatile memory will be increased. This is quite disadvantageous for nonvolatile memory which is applied in portable electronic products which demand low power consumption.

Referring to FIG. 1, a flash memory disclosed in U.S. Pat. No. 6,897,116 is shown, wherein the flash memory is disposed on a substrate 110 and comprises a gate oxide layer 111, floating gates 130, insulating stacked structures 115, and control gates 116 sequentially arranged thereon. The floating gates 130 with semiconductor spacers are utilized to increase an equivalent capacitor area between the floating gates 130 and the control gates 116. Thus, the GCR of the flash memory can be increased.

However, in the above flash memory, the gaps between the floating gates 130 are relatively small, so that short circuits easily occur in the floating gates 130 due to incomplete etching or conductor scraps dropped in the gaps; and the whole flash memory may be rendered defective.

Besides, the above flash memory is an NOR type array structure with larger area and lower integration. In other words, the capacity of this NOR flash memory is relatively small, and therefore not suitable for products requiring large memory capacity.

As for ordinary NAND flash memory, in order to increase the GCR, the floating gates are usually disposed across the isolation structures to increase the equivalent capacitor area between the floating gates and the control gates. However, since the floating gates are formed through lithographic etching, as the size of elements become increasingly small, overlaying errors easily occur during exposure and development, and thereby causing short circuits in the memory, and the reliability of the memory is deteriorated.

Therefore, how to manufacture a flash memory with a high coupling ratio and high integration in a limited chip area through a simple method is an important issue.

SUMMARY OF THE INVENTION

In view of the above, an object of the present invention is to provide a method for manufacturing a NAND flash memory, wherein the floating gate is formed by self-aligned manner.

Another purpose of the present invention is to provide a method for manufacturing a NAND flash memory, which can reduce processing steps, increase the throughput, and meanwhile avoid defects in the memory.

A method for manufacturing a NAND flash memory is provided by present invention, wherein a substrate is provided. Next, a tunneling dielectric layer, a first conductive layer and a mask layer are sequentially formed on the substrate. Next, a plurality of isolation structures is formed in the mask layer, the first conductive layer, the tunneling dielectric layer and the substrate. Next, the mask layer is removed so that the top surface of each isolation structure is higher than that of the first conductive layer. Next, a second conductive layer is formed on the exposed sidewalls of the isolation structures. Thereafter, an inter-gate dielectric layer and a third conductive layer are sequentially formed on the substrate.

In the above method for manufacturing a NAND flash memory, the step of forming the second conductive layer comprises, for example, forming a conductive material layer on the substrate; and then removing the conductive material layer on the isolation structures using the isolation structures as self-aligning masks.

In the above method for manufacturing a NAND flash memory, the conductive material layer on the isolation structures is removed by employing an anisotropic etching process. In the step of anisotropic etching, an additional step of removing a portion of the first conductive layer is further included.

In the above method for manufacturing a NAND flash memory, the step of forming the isolation structures comprises, for example, forming a patterned photoresist layer on the mask layer; and then removing portions of the mask layer, the first conductive layer, the tunneling dielectric layer and the substrate using the patterned photoresist layer as a mask to form a plurality of trenches; removing the patterned photoresist layer; and filling the trenches to form the isolation structures with an insulating material.

In the above method for manufacturing a NAND flash memory, the inter-gate dielectric layer comprises, for example, silicon oxide-silicon nitride-silicon oxide. The material of the second conductive layer is, for example, doped poly-silicon. The mask layer comprises, for example, silicon nitride.

In the above method for manufacturing a NAND flash memory, the tunneling dielectric layer is formed, e.g., through a thermal oxidization process.

In the above method for manufacturing a NAND flash memory, a floating gate (the second conductor layer and the first conductor layer) are formed using the isolation structures as self-aligning masks, so as to omit a mask process and thereby increase the throughput and reduce the overall manufacturing cost.

Another method for manufacturing a NAND flash memory is provided by present invention, wherein, for example, a substrate is provided; a tunneling dielectric layer and a first conductive layer are sequentially formed on the substrate; a plurality of isolation structures is formed in the first conductive layer, the tunneling dielectric layer and the substrate; a portion of the isolation structures is removed, such that the top surface of each isolation structure is lower than that of the first conductive layer; and the inter-gate dielectric layer and the third conductive layer are subsequently formed on the substrate.

The above method for manufacturing a NAND flash memory further includes a step of forming a mask layer after the step of forming the tunneling dielectric layer and the first conductive layer. The isolation structures are formed in the mask layer, the first conductive layer, the tunneling dielectric layer and the substrate. Additionally, the step of removing a portion of each isolation structure further includes using the mask layer as a mask. The mask layer comprises, for example, silicon nitride.

In the above method for manufacturing a NAND flash memory, a portion of the isolation structures is removed using, for example, anisotropic etching process.

In the above method for manufacturing a NAND flash memory, the inter-gate dielectric layer comprises, for example, silicon oxide-silicon nitride-silicon oxide. The first conductive layer comprises, for example, doped poly-silicon.

In the above method for manufacturing a NAND flash memory, the tunneling dielectric layer is formed using a thermal oxidation process.

In the above method for manufacturing a NAND flash memory, a portion of the isolation structures is removed so that the top surface of each isolation structure is lower than that of the first conductive layer, and a portion of the sidewalls of the first conductive layer (floating gate) is exposed. Thus, not only a mask process omitted, but also the problem due to occurrence of short circuits in the memory can be avoided. Additionally, sidewall area of the floating gate also can be utilized to increase the GCR between the floating gate and the control gate.

In order to the make aforementioned and other objects, features and advantages of the present invention comprehensible, preferred embodiments accompanied with Figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIG. 2A to FIG. 2E are cross-sectional view of the manufacture process of the NAND flash memory according to an embodiment of the present invention. First, referring to FIG. 2A, for example, a substrate 200 is provided; and a tunneling dielectric layer 210, a first conductive layer 220 and a mask layer 223 are sequentially formed on the substrate 200. The substrate 200 comprises, for example, a silicon substrate. The tunneling dielectric layer 210 comprises, for example, silicon oxide; and the tunneling dielectric layer 210 is formed by, for example, thermal oxidization or chemical vapor deposition (CVD) process. The conductive layer 220 comprises, for example, doped poly-silicon; and is formed through an ion-implantation process after a layer of undoped poly-silicon has already been formed through CVD process or by adopting an in-situ implanting operation in a CVD process. The mask layer 223 comprises, for example, silicon nitride; and the mask layer 223 is formed by, for example, a CVD process.

Figure 1:
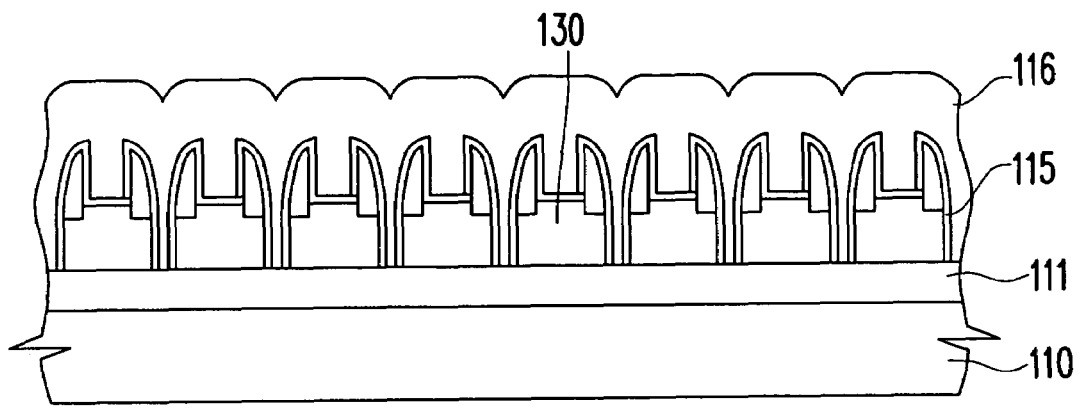
FIG. 1 is a cross-sectional view of a structure of a conventional flash memory.
Figure 2A:
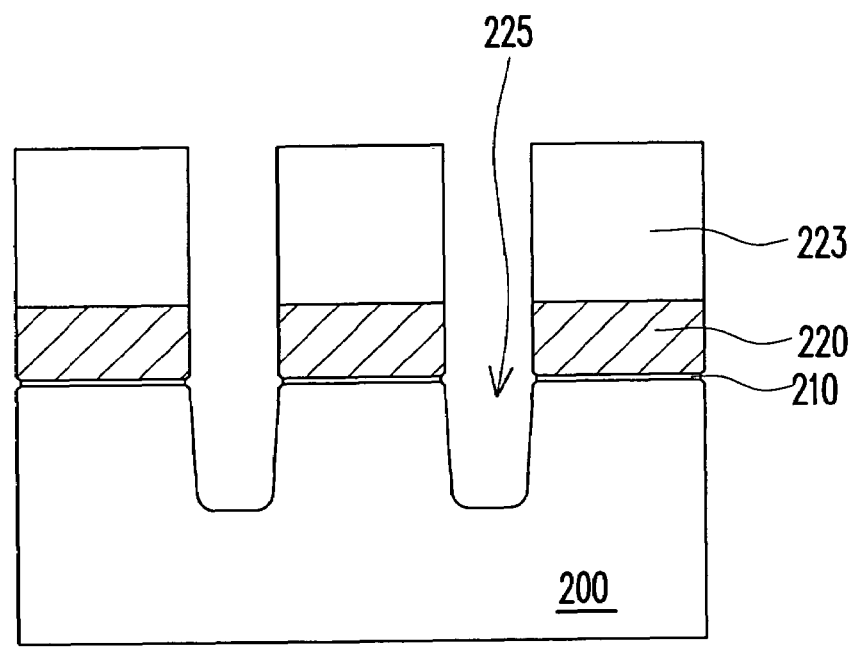
FIG. 2A to FIG. 2E are cross-sectional views of the manufacturing process of the NAND flash memory according to an embodiment of the present invention.

Referring to FIG. 2A, portions of the mask layer 223, the conductive layer 220, the tunneling dielectric layer 210 and the substrate 200 are removed to form a plurality of trenches 225. The process of removing the portions of the mask layer 223, the conductive layer 220, the tunneling dielectric layer 210 and the substrate 200 comprises, for example, forming a patterned photoresist layer (not shown) on the mask layer 223; removing the exposed mask layer 223, portions of the conductive layer 220, the tunneling dielectric layer 210 and the substrate 200 underneath the exposed mask layer 223 by performing a reactive ion etching process using the patterned photoresist layer as a mask; and removing the patterned photoresist layer to form the trenches 225.

Figure 2B:
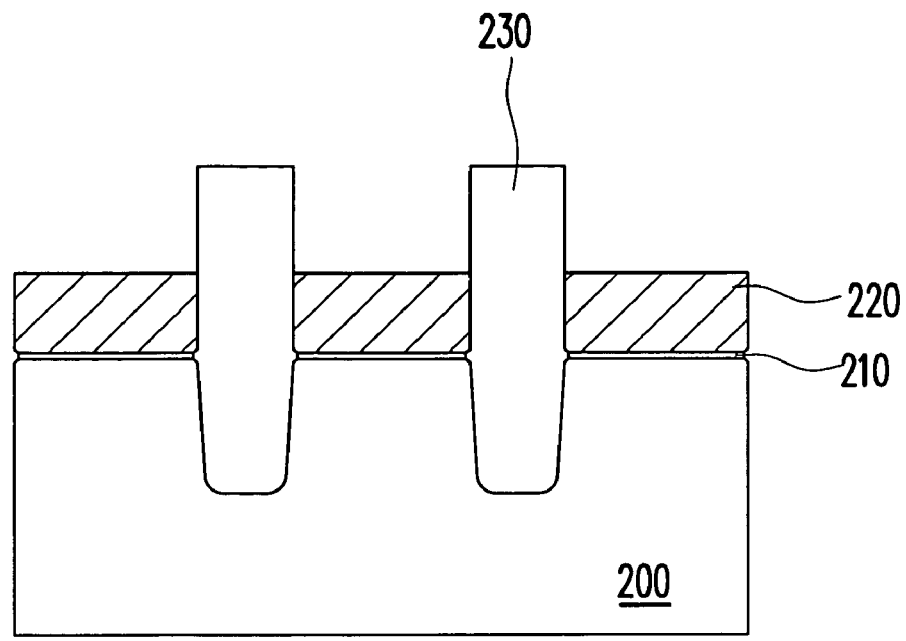

Referring to FIG. 2B, an insulating material is filled into the trenches 225 to form the isolation structures 230. The step of forming the isolation structures 230 is illustrated as follows. For example, an insulating material layer is deposited on the substrate 200 by performing, for example, a high density plasma CVD process, wherein the insulating material is, e.g., silicon oxide. The insulating material may cover the mask layer 223 and may be subsequently planarized using the mask layer 223 as a stop layer by using, for example, a chemical mechanical polishing process to form the isolation structures 230 with planarized topography. The conductive layer 220 is exposed alter removing the mask layer 223, so that the top surface of each isolation structure is higher than that of the conductive layer 220. The mask layer 223 is removed by using an anisotropic etching process.

Figure 2C:
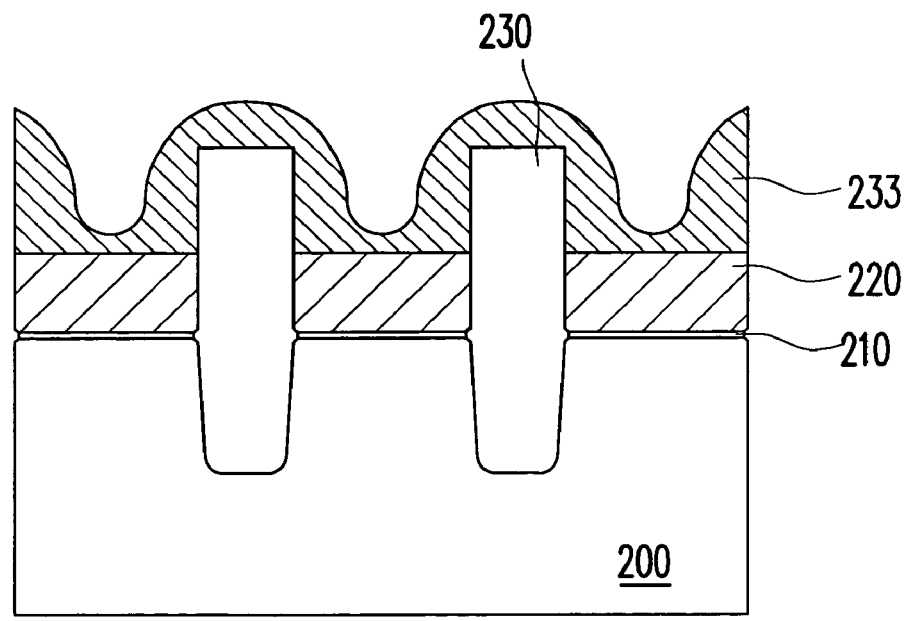

Referring to FIG. 2C, a conductive material layer 233 is formed on the substrate 200. The conductive material layer 233 comprises, for example, doped poly-silicon, and the conductive material layer 233 is formed employing an ion-implantation process to implant dopants into an undoped poly-silicon layer; or adopting an in-situ implanting operation in a CVD process. The conductive layer 233 is, for example, a single layer and covers the isolation structures 230.

Figure 2D:
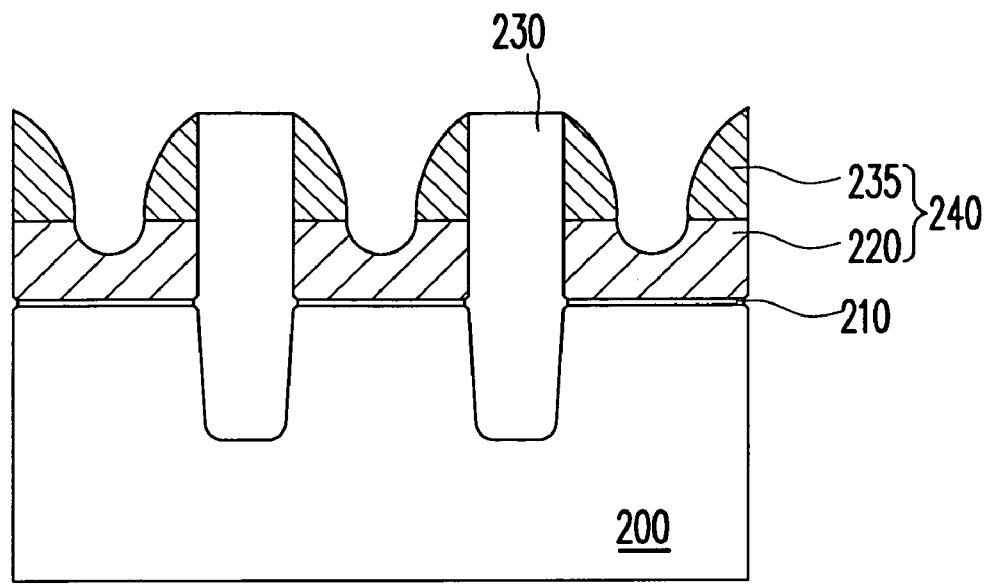

Referring to FIG. 2D, a portion of the conductive material layer 233 is removed using the isolation structures 230 as self-aligning masks to form a conductive layer 235 on the sidewalls of the isolation structures 230. A portion of the conductive material layer 233 is removed by performing, for example, anisotropic etching process, such as reactive ion etching process. During the anisotropic etching process shown in FIG. 2D, a portion of the conductive layer 220 may also be removed. Thus, a floating gate 240 of the flash memory comprising the conductive layer 235 and the conductive layer 220 is formed.

Figure 2E:
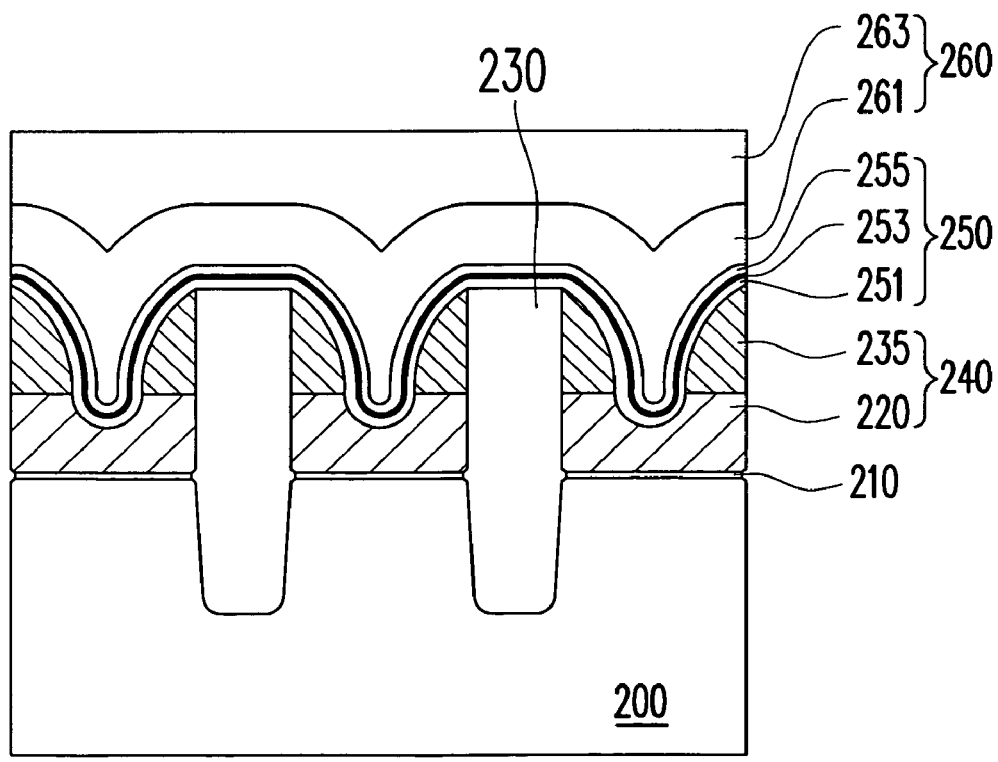

Referring to FIG. 2E, an inter-gate dielectric layer 250 is formed on the substrate 200, wherein the inter-gate dielectric layer 250 is, for example, a composite dielectric layer comprising a silicon oxide layer 251, a silicon nitride layer 253 and a silicon oxide layer 255, or it comprises a dielectric material such as silicon oxide or silicon nitride formed by, for example, a CVD process.

Next, a conductive layer 261 is formed on the inter-gate dielectric layer 250. The conductive layer 261 comprises, for example, doped poly-silicon, and the conductive layer 261 is formed by using, for example, an ion-implantation process by implanting dopants into an undoped poly-silicon; or an in-situ implanting operation in a CVD process. Next, a metal silicide layer 263 may be further formed on the conductive layer 261. The metal silicide layer 263 comprises, for example, tungsten silicide, and the metal silicide layer 263 is formed by, for example, depositing a layer of metal silicide using a CVD process, and then performing a thermal process to reduce the resistance of metal silicide. Thus, a control gate 260 comprising the conductive layer 261 and the metal silicide layer 263 is formed.

Thereafter, subsequent processes well known to those skilled in the art may be proceeded to complete manufacture of the NAND flash memory, and thus will not be described herein.

In the above embodiments, the floating gate 240 is formed by removing a portion of the conductive material layer 233 and a portion of the conductive layer 220 using the isolation structures 230 as self-aligning masks. In other words, according to the embodiment of the present invention the flash memory with a high GCR may be manufactured without photolithographic process and defects due to misalignment may be effectively avoided. Thus, not only can the throughput is increased, but also defects due occurrence of short circuits may also be avoided. Thus, the reliability of the memory can be effectively improved.

Another method for manufacturing a NAND flash memory according to the present invention will be described below with reference to FIGS. 3A-3C.

Figure 3A:
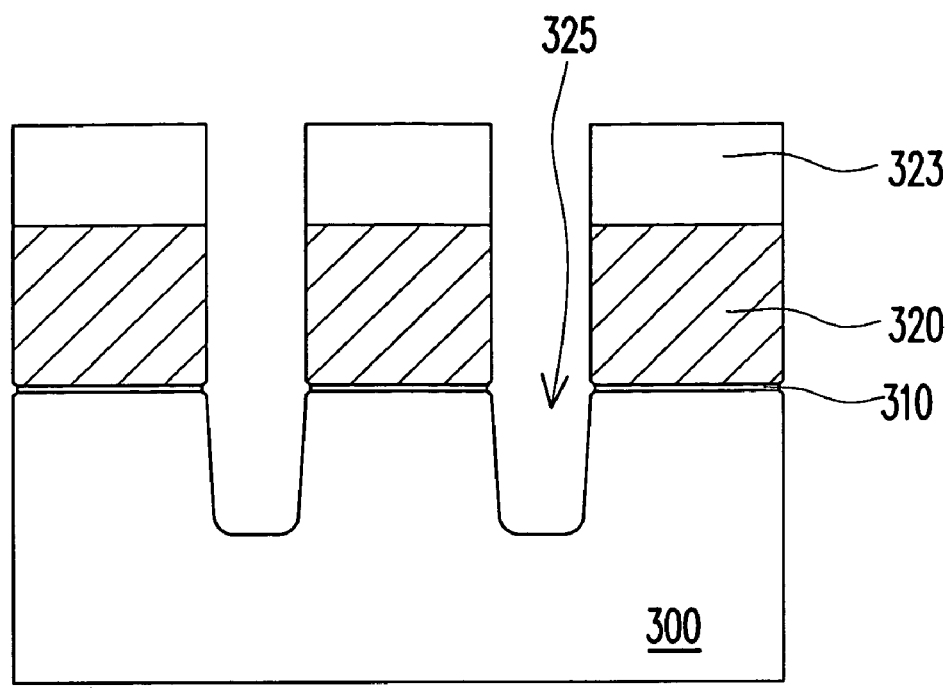
FIG. 3A to FIG. 3C are cross-sectional views of the manufacturing process of the NAND flash memory according to another embodiment of the present invention.

Referring to FIG. 3A, a substrate 300 is provided. Next, a tunneling dielectric layer 310, a conductive layer 320 and a mask layer 323 are sequentially formed on the substrate 300, wherein the mask layer 323 may be selectively disposed according to the design. The substrate 300 comprises, for example, a silicon substrate. The tunneling dielectric layer 310 comprises, for example, silicon oxide, and may be formed by, for example, thermal oxidization or a CVD process. The conductive layer 320 comprises, for example, doped poly-silicon, and may be formed using an ion-implantation process by implanting dopants into a layer of un-doped poly-silicon or formed by adopting an in-situ implanting operation in a CVD process. The mask layer 323 comprises, for example, silicon nitride, and may be formed by performing, for example, a CVD process.

Referring to FIG. 3A, portions of the mask layer 323, the conductive layer 320, the tunneling dielectric layer 310 and the substrate 300 are removed to form a plurality of trenches 325. The removal of portions of the mask layer 323, the conductive layer 320, the tunneling dielectric layer 310 and the substrate 300 is illustrated as follows. First, a patterned photoresist layer (not shown) is formed on the mask layer 323; the exposed portion of the mask layer 323, the portions of the conductive layer 320, the tunneling dielectric layer 310 and the substrate 300 underneath the exposed portion of the mask layer 323 are removed by performing a reactive ion etching process using the patterned photoresist layer as a mask; and the patterned photoresist layer is removed to form the trenches 325.

Figure 3B:
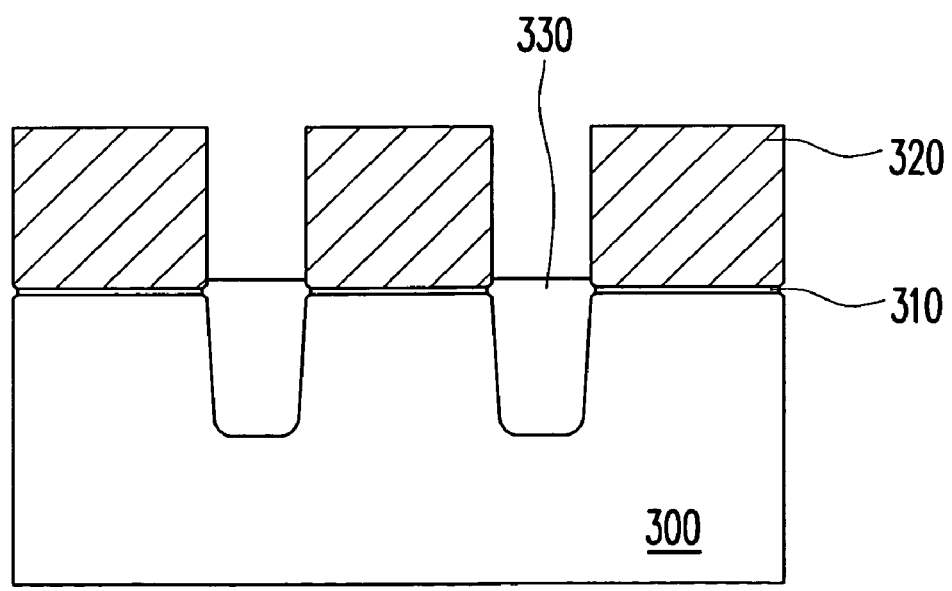

Next, referring to FIG. 3A and FIG. 3B, an insulating material is filled into the trenches 325 to form the isolation structures 330. The insulating material may be formed on the substrate 300 by performing, for example, a high density plasma CVD process, wherein the insulating material comprises e.g., silicon oxide. The insulating material so formed may cover the mask layer 323, and may be planarized by performing, for example, a chemical mechanical polishing process or etching back process using the mask layer 323 as a stop layer to form the isolation structures 330 with planarized topography.

Next, a portion of the isolation structures 330 is removed such that the top surfaces of the isolation structures 330 are lower than that of the conductive layer 320 and the sidewalls of the conductive layer 320 are exposed. A portion of the isolation structure 330 is removed by performing, for example, an anisotropic etching process, such as a reactive ion etching process.

It should be noted that, in this embodiment, the conductive layer 320 is the floating gate of the flash memory, such that the more the isolation structures 330 are removed, the greater the surface area of the exposed sidewalls of the floating gate. In other words, the equivalent capacitor area between the floating gate and the subsequently-formed control gate will be correspondingly larger, so that the GCR of the flash memory may be further increased.

The top surfaces of isolation structures 330 are preferably higher than that of tunneling dielectric layer 310, so as to avoid the undesirable electrical connection between the substrate 300 and the conductive layer 320.

Of course, the higher the conductive layer 320 is, the larger the surface area of the exposed sidewalls will be, and the GCR is also influenced. The height of the conductive layer 320 depends on the design requirements.

Then, referring to FIG. 3B, the conductive layer 320 is exposed by removing the mask layer 323, wherein the mask layer 323 may be removed by performing, for example, an anisotropic etching process.

Figure 3C:
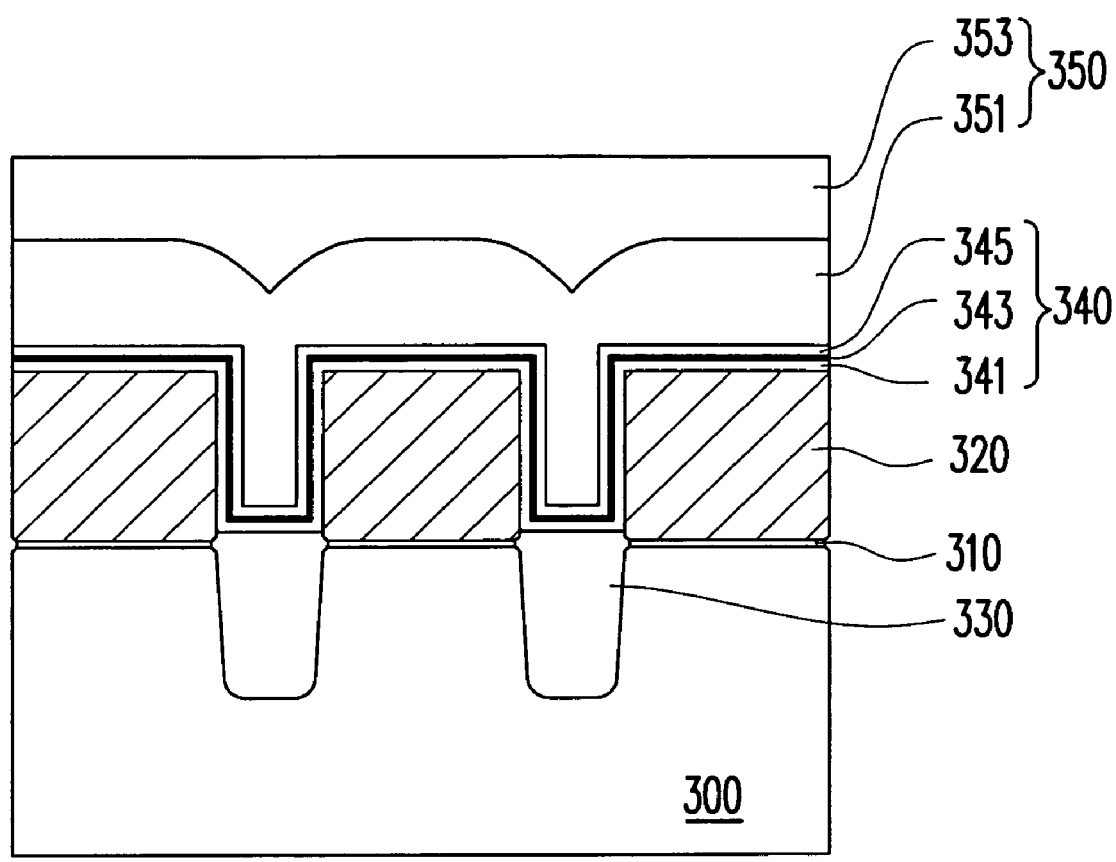

Next, referring to FIG. 3C, an inter-gate dielectric layer 340 is formed on the substrate 300, wherein the inter-gate dielectric layer 340 comprises a composite dielectric layer formed by stacking of a silicon oxide layer 341, a silicon nitride layer 343, and a silicon oxide layer 345; or the inter-gate dielectric layer 340 comprises a dielectric material, such as silicon oxide or silicon nitride formed by, for example, a CVD process.

Next, a conductive layer 351 is formed on the inter-gate dielectric layer 340, and comprises for example, doped poly-silicon, and the conductive layer 351 is formed by using, for example, an ion-implantation process by implanting dopants into an undoped poly-silicon; or by adopting an in-situ implanting operation in a CVD process. Next, a metal silicide layer 353 may be further formed on the conductive layer 351. The material of the metal silicide layer 353 comprises, for example, tungsten silicide, and may be formed, for example, by depositing a metal silicide layer by using a CVD process, and then performing a thermal process to reduce the resistance of the metal silicide. Thus, the control gate 350 of the flash memory comprising the conductive layer 351 and the metal silicide layer 353 is formed.

Thereafter, subsequent processes well known to those skilled in the art may be carried out to complete the manufacture of the NAND flash memory, and thus will not be described herein.

In the above described embodiment, the floating gate and the control gate can be formed as long as two conductive materials (conductive layer 320 and conductive layer 351) are formed, and the throughput can be increased.

In addition, the sidewalls of the conductive layer 320 (floating gate) are exposed by removing a portion of the isolation structures 330. Thus, not only is a photolithographic process may be omitted, but also misalignment problems may be effectively avoided, thereby preventing defects in the memory device. Thus, the manufacturing process of a memory device favors to the progress of the next generation.

Additionally, the equivalent capacitor area between the floating gate and the control gate may also be increased by utilizing the surface area of the sidewalls of the conductive layer 320 (floating gate), such that the GCR will be increased, and the operation speed and efficiency of the memory will be further improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a memory, comprising:
providing a substrate;
forming a plurality of tunneling dielectric layer, and a plurality of bottom conductive layer on the substrate;
forming a plurality of isolation structures in the substrate between the bottom conductive layers, wherein each isolation structure has a top surface exposed entirely;
forming an inter-gate dielectric layer on the substrate to contact with the bottom conductive layer and the whole of the top surface; and
forming a top conductive layer on the inter-gate dielectric layer.

2. The method for manufacturing the memory as claimed in claim 1, wherein the inter-gate dielectric layer comprises silicon oxide-silicon nitride-silicon oxide.

3. The method for manufacturing the memory as claimed in claim 1, wherein the material of the bottom conductive layer layers comprises doped poly-silicon.

4. The method for manufacturing the memory as claimed in claim 1, wherein the steps of forming the tunneling dielectric layers, the bottom conductive layers and the isolation structures comprises:
forming a tunneling dielectric material layer, a first conductive material layer and a mask material layer on the substrate in sequence;
patterning the tunneling dielectric material layer, the first conductive material layer and the mask material layer to form the tunneling dielectric layer, a plurality of first conductive layer and a plurality of mask layer;
forming the plurality of isolation structure in and on the substrate, wherein the top surfaces of the isolation structures are higher than those of the first conductive layers;
removing the mask layers to expose the whole of the top surfaces and portions of sidewalls of the isolation structures; and
forming a plurality of second conductive layer on a plurality of exposed sidewalls of the isolation structures, wherein the first conductive layers and the second conductive layers together constitute the bottom conductive layers.

5. The method for manufacturing the memory as claimed in claim 4, wherein the step of forming the second conductive layer comprises:
forming a second conductive material layer on the substrate; and
removing at least the second conductive material layer on the isolation structures using the isolation structures as self-aligning masks to expose the whole of the top surfaces of the isolation structures.

6. The method for manufacturing the memory as claimed in claim 5, wherein the second conductive material layer on the isolation structures is removed by performing an anisotropic etching process.

7. The method for manufacturing the memory as claimed in claim 6, wherein the step of the anisotropic etching further comprises removing portions of the first conductive layers.

8. The method for manufacturing the memory as claimed in claim 4, wherein the step of forming the isolation structures comprises:
forming a patterned photoresist layer on the mask material layer;
using the patterned photoresist layer as a mask, removing portions of the substrate to form a plurality of trenches;
removing the patterned photoresist layer; and
filling the trenches and a plurality of gap between the mask layers using an insulating material to form the isolation structures.

9. The method for manufacturing the memory as claimed in claim 4, wherein the tunneling dielectric material layer is formed using a thermal oxidization process.

10. The method for manufacturing the memory as claimed in claim 4, wherein the material of the first and the second conductive layer layers comprises doped poly-silicon.

11. The method for manufacturing the memory as claimed in claim 4, wherein the mask material layer comprises silicon nitride.

12. The method for manufacturing the flash memory as claimed in claim 1, wherein the steps of forming the tunneling dielectric layers, the bottom conductive layers, the isolation structures and the inter-gate dielectric layer comprising:
sequentially forming a tunneling dielectric material layer and a conductive material layer on the substrate;
patterning the tunneling dielectric material layer and the conductive material layer to form the plurality of tunneling dielectric layer and the plurality of bottom conductive layer;
forming a plurality of isolation structures in the substrate, wherein the top surface of each isolation structure is lower than a plurality of top surface of the bottom conductive layers so that the top surfaces and the sidewalls of the bottom conductive layers are exposed; and
forming an inter-gate dielectric layer on the substrate to contact with the top surfaces and the sidewalls of the bottom conductive layers and the whole of the top surfaces of the isolation structures.

13. The method for manufacturing the memory as claimed in claim 12, further comprising a step of forming a mask material layer on the conductive material layer.

14. The method for manufacturing the memory as claimed in claim 13, wherein the step of forming the isolation structures comprising:
forming a patterned photoresist layer on the mask material layer;
using the patterned photoresist layer as a mask, performing the step of patterning the tunneling dielectric material layer and the conductive material layer and simultaneously patterning the mask material layer and removing portions of the substrate to form the tunneling dielectric layers, the bottom conductive layers, a plurality of mask layer and a plurality of trench in the substrate;
removing the patterned photoresist layer;
filling the trenches and a plurality of gap between the mask layers using an insulating material; and
removing portions of the insulating material to form the isolation structures and to expose the top surfaces and the sidewalls of the bottom conductive layers.

15. The method for manufacturing the flash memory as claimed in claim 13, wherein the mask material layer comprises silicon nitride.

16. The method for manufacturing the memory as claimed in claim 14, wherein the step of the removing portions of the insulating material is performed by performing an anisotropic etching process.

* * * * *